United States Patent [19]

Shiba et al.

[11] Patent Number: 5,195,075
[45] Date of Patent: Mar. 16, 1993

[54] OUTPUT LEVEL CONTROLLING APPARATUS

[75] Inventors: Takahumi Shiba; Hirokazu Inotani; Fumihiro Nakajima; Seiichi Hasebe, all of Tokorozawa, Japan

[73] Assignee: Pioneer Electronic Corporation, Tokyo, Japan

[21] Appl. No.: 693,866

[22] Filed: Apr. 30, 1991

[30] Foreign Application Priority Data

Oct. 9, 1990 [JP] Japan .................................. 2-270710

[51] Int. Cl.$^5$ .................... G11B 20/00; H03G 3/00
[52] U.S. Cl. .................................. 369/53; 381/107; 369/54; 369/86; 369/124
[58] Field of Search ................ 369/32, 48, 49, 33, 369/34, 53, 54, 86, 87, 88, 89, 90, 2, 3, 36, 124, 28; 360/46; 381/104–109; 358/342, 314, 315

[56] References Cited

U.S. PATENT DOCUMENTS

| 4,297,527 | 10/1981 | Pate | 381/107 |
| 4,926,485 | 5/1990 | Yamashita | 381/107 |
| 4,993,008 | 2/1991 | Shiba | 369/36 |

*Primary Examiner*—Wayne R. Young
*Assistant Examiner*—Thang V. Tran
*Attorney, Agent, or Firm*—Sughrue, Mion, Zinn, Macpeak & Seas

[57] ABSTRACT

An output level controlling apparatus comprises: a signal attenuating device for attenuating the reproduced output level of a reading/recording signal read from a record medium; a signal level deciding device for comparing the reproduced output level of the reading/recording signal to a reference signal level previously set; and an output level correcting device for sending a control signal to the signal attenuating device on the basis of the results of the comparison made by the signal level deciding device so as to attenuate the reproduced output level of the reading/recording signal when a reproduced output level is higher than the signal level of the reference signal and so as to decrease an attenuation amount of the reproduced output signal level of the reading/recording signal when the reproduced output signal level is lower than the signal level of the reference signal wherein the output level correcting device sends the control signal so as to rapidly attenuate the reproduced output level of the reading/recording signal and slowly increase the reproduced output level. It is therefore possible to momentarily attenuate a high input level for preventing the output in a high level and prevent the musical environment of BGM from being destroyed and aural sound vibrations from occurring during level adjustment.

12 Claims, 4 Drawing Sheets

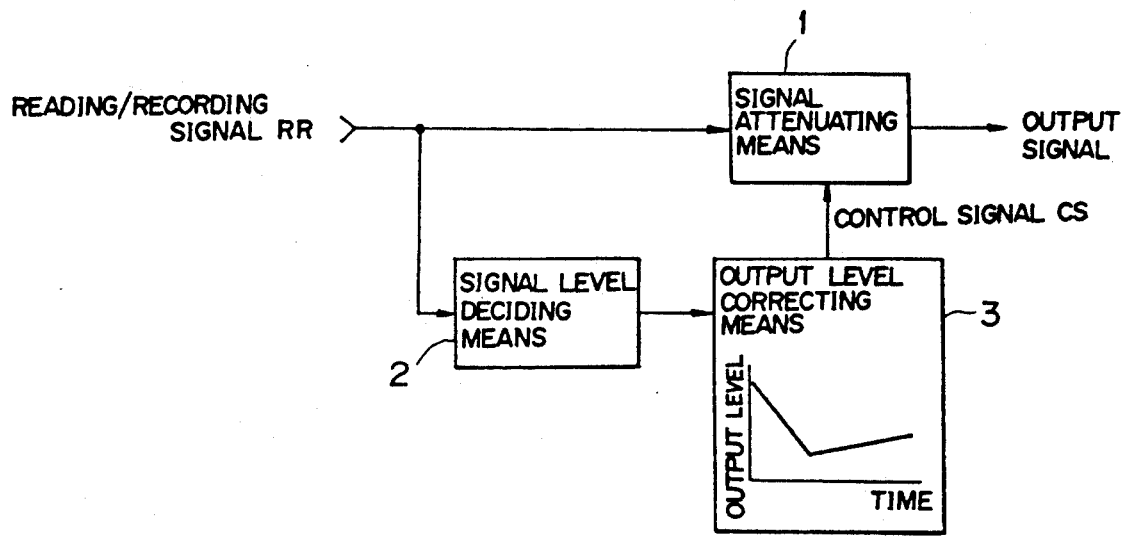
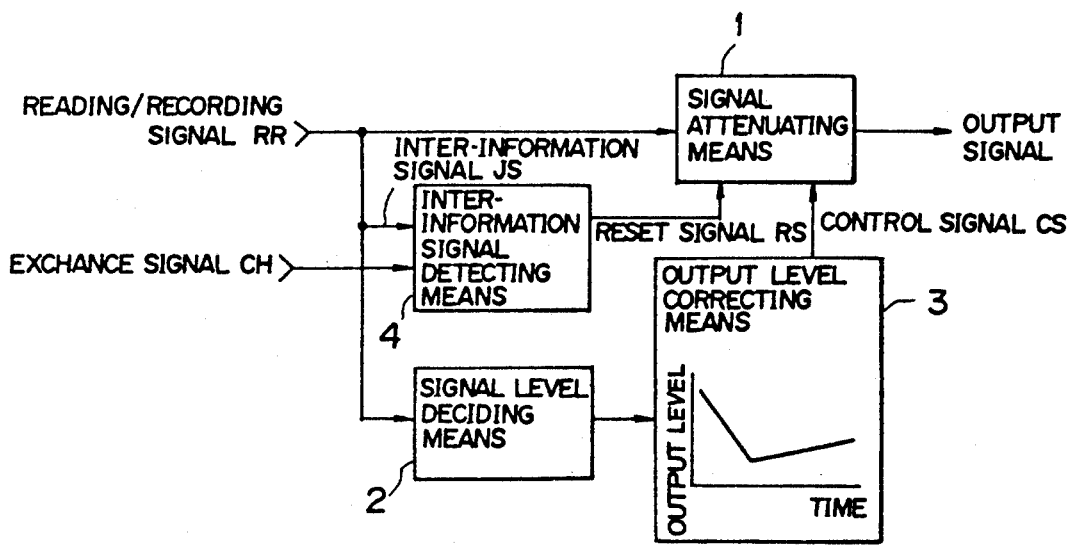

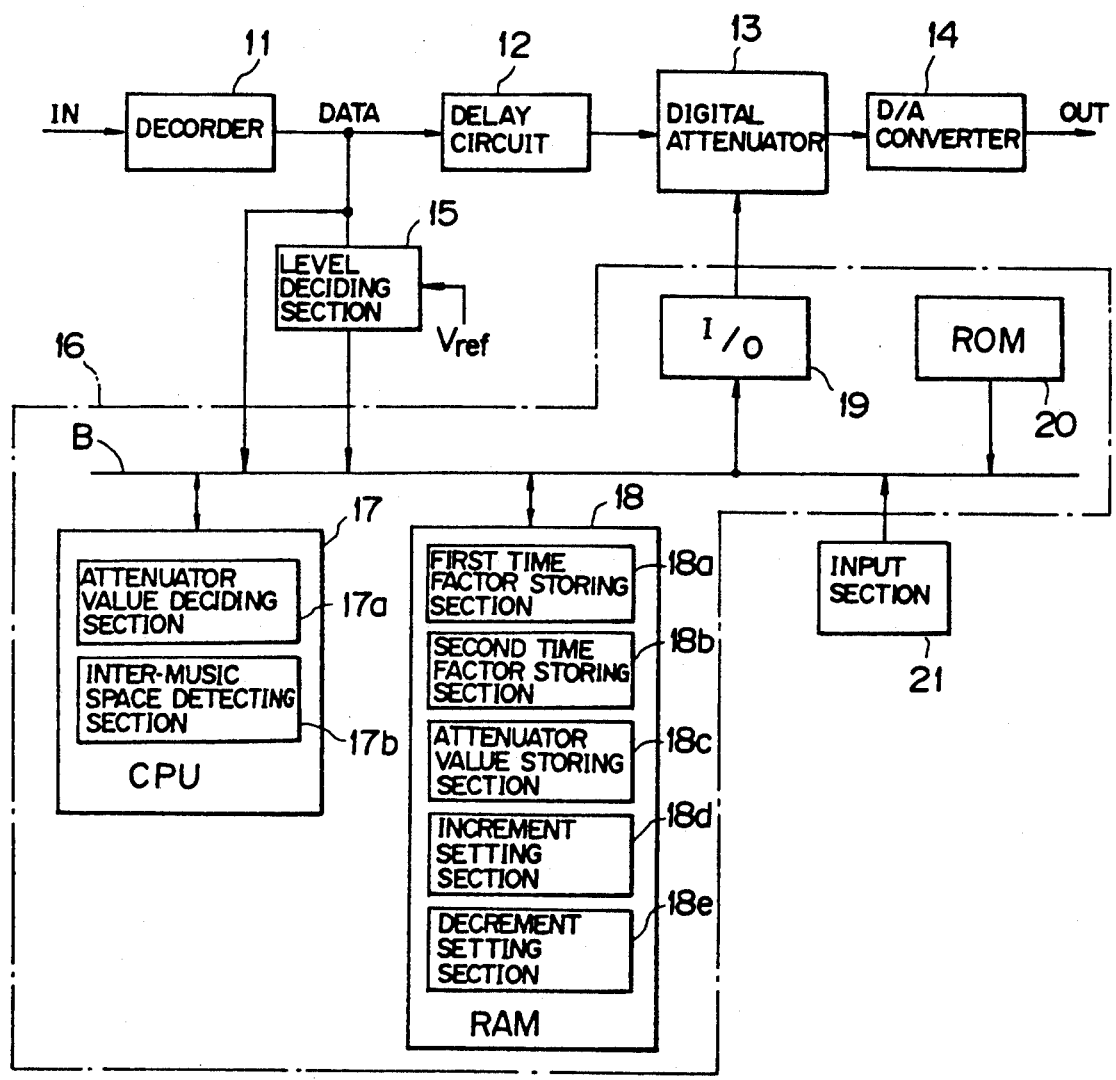

OUTPUT LEVEL CONTROLLING APPARATUS

BACKGROUND OF THE INVENTION

The present invention relates to an output level controlling apparatus in an apparatus for reproducing recorded information, and more particularly to an improvement in an output level controlling apparatus for controlling the reproduced output level of a reproduced digital signal by means of a digital attenuator.

For example, a compact disk (CD) is sometimes used as a music source for background music (BGM), and a plurality of compact disks CD are sometimes loaded in an automatic player in which the compact disks CD are continuously played to produce BGM.

In such cases, since the reproduced output levels of compact disks depend upon the recording conditions and the like of the disks and are thus different from each other, if an acoustic signal is output by continuously reproducing a plurality of compact disks, the output level sometimes suddenly increases or conversely suddenly decreases at each time the compact disk played is replaced by a new disk. In addition, when the pieces of music in the same compact disk are continuously played, the pieces of music have different output levels, the same variations as those described above occur in the output level. This defeats the purpose of BGM to form, as background music, a comfortable music environment. In order to prevent such a problem, it is though that a sudden change in an output level is restrained by keeping the output level of music within a predetermined region.

In an example of such control means, the peak value of each of the signal levels of the information recorded on all compact disks (for example, 6 disks) loaded in an automatic player may be previously read, and the read peak values may be matched to the lowest peak value. However, in this control means, since all compact disks must be reproduced for reading the peak value of each of the signals, a certain time is required for preparation before BGM playing.

The inventors thus proposed an output level controlling apparatus in a feedforward system in which an appropriate output level for BGM is previously statistically determined to produce a reference value of output levels, and an actual output level is compared with the reference value so that the appropriate output level is maintained by controlling a digital attenuator in accordance with the reproduced output level of the reading/recording signal with the results of comparison (Japanese Patent Laid-Open No. 1-231510). Since this apparatus employs the feedforward system, no time is required for preparation.

However, in the above-described conventional means, when a signal level is either attenuated or increased, the output level changes to a value above and below the reference value in the vicinity thereof because the changing time and changing amount of the signal level are constant, and aural sound vibrations, i.e., a feel of instability, thus occurs.

It is considered that such sound vibrations can be removed by setting a time for changing a level to be long.

However, when the time for changing a level is set to be long, if a high level is input, the level cannot be momentarily attenuated. This is undesirable because the output level, i.e., loudness is increased, and the music environment of BGM is thus destroyed.

In BGM, plural pieces of music or a plurality of record media are continuously reproduced. When a piece of music is continuously reproduced while maintaining the attenuation amount of the prior piece of music, for example, if the level of the music to be reproduced is low, the starting portion of the music cannot be heard.

SUMMARY OF THE INVENTION

Accordingly, it is an object of the present invention to provide an output level controlling apparatus which is capable of removing aural sound vibrations and momentarily attenuating a high input level which eliminates the problem that the starting portion of music cannot be heard even if plural pieces of music are continuously reproduced.

In order to achieve the object described above, an output level controlling apparatus of the present invention includes a signal attenuating means for attenuating a reproduced output level of a reading/recording signal which is read from a record medium; signal level deciding means for comparing a reproduced output level of the reading/recording signal to the level of the reference signal previously set; and output level correcting means for sending a control signal to the signal attenuating means on the basis of the results of the comparison made by the signal level deciding means so as to increase an attenuation amount of the reproduced output level of the reading/recording signal when the reproduced output level of the reading/recording signal is higher than the reference signal level and so as to decrease an attenuation amount of the reproduced output level of the reading/recording signal when the reproduced output level of the reading/recording signal is lower than the reference signal level, the output level correcting means sending the control signal so as to rapidly attenuate the reproduced output level of the reading/recording signal and slowly increase the reproduced output level.

In another preferred embodiment of the present invention, an output level controlling apparatus includes a signal attenuating means for attenuating a reproduced output level of a reading/recording signal read from the record medium; inter-information signal detecting means for detecting an exchange signal generated in exchange of a plurality of record media or an inter-information signal in the reading/recording signal; signal level deciding means for comparing the reproduced output level of the reading/recording signal with the level of a reference signal previously set; and output level correcting means for sending a control signal to the signal attenuating means on the basis of the results of the comparison made by the signal level deciding means so as to increase an attenuation amount of the reproduced output level of the reading/recording signal when the reproduced output level of the reading/recording signal is higher than the reference signal level and so as to decrease an attenuation amount of the reproduced output level of the reading/recording signal when the reproduced output level of the reading/recording signal is lower than the reference signal level, the output level correcting means sending the control signal so as to rapidly attenuate the reproduced output level of the reading/recording signal and slowly increase the reproduced output level, the inter-information signal detecting means sending a reset signal for returning the attenuation amount set in the signal attenuating means to an initial value when detecting the exchange signal of the record media or the inter-information signal.

In the present invention, the reading/recording signal is input to the signal attenuating means and the level deciding means. The reference signal level is previously set in the level deciding means, and the output level correcting means sends the control signal to the signal attenuating means so as to rapidly attenuate the reproduced output level of the reading/recording signal when the reproduced output level of the reading-/recording signal is higher than the reference signal level. Conversely, when the reproduced output level is lower than the reference signal level, the output level correcting means sends the control signal to the attenuating means so as to slowly increase the reproduced output level of the reading/recording signal.

In another preferred form of the present invention, the reading/recording signal is input to the signal attenuating means, the level deciding means and the inter-information signal detecting means, respectively. When the record medium used is replaced by a new medium, the exchange signal is input to the inter-information signal detecting means. The reference signal level is previously set in the level deciding means so that the output level correcting means sends the control signal to the signal attenuating means so as to rapidly attenuate the reproduced output level of the reading/recording signal when the reproduced output level of the reading-/recording signal is higher than the reference signal level. An attenuation value corresponding to the control signal is set in the signal attenuating means. Conversely, when the reproduced output level is lower than the reference signal level, the output level correcting means sends the control signal to the attenuating means so as to slowly increase the reproduced output level of the reading/recording signal. An attenuation value corresponding to the control signal is set in the signal attenuating means.

In this state, the exchange signal or the inter-information signal in the reading/recording signal is detected by the inter-information signal detecting means. On the basis of the detected information, the reset signal for returning the set attenuation value to an initial value is sent to the attenuating means so that the set attenuation value is returned to the initial value.

Further objects, features and other aspects of this invention will be understood from the following detailed description of the preferred embodiments of his invention with reference to the drawings.

BRIEF DESCRIPTION OF THE DRAWINGS

FIG. 1 is an explanatory view of the principle of a first embodiment of the present invention;

FIG. 2 is an explanatory view of the principle of a second embodiment of the present invention;

FIG. 3 is a block diagram of an embodiment of the present invention;

DESCRIPTION OF THE PREFERRED EMBODIMENTS

Figure 4:
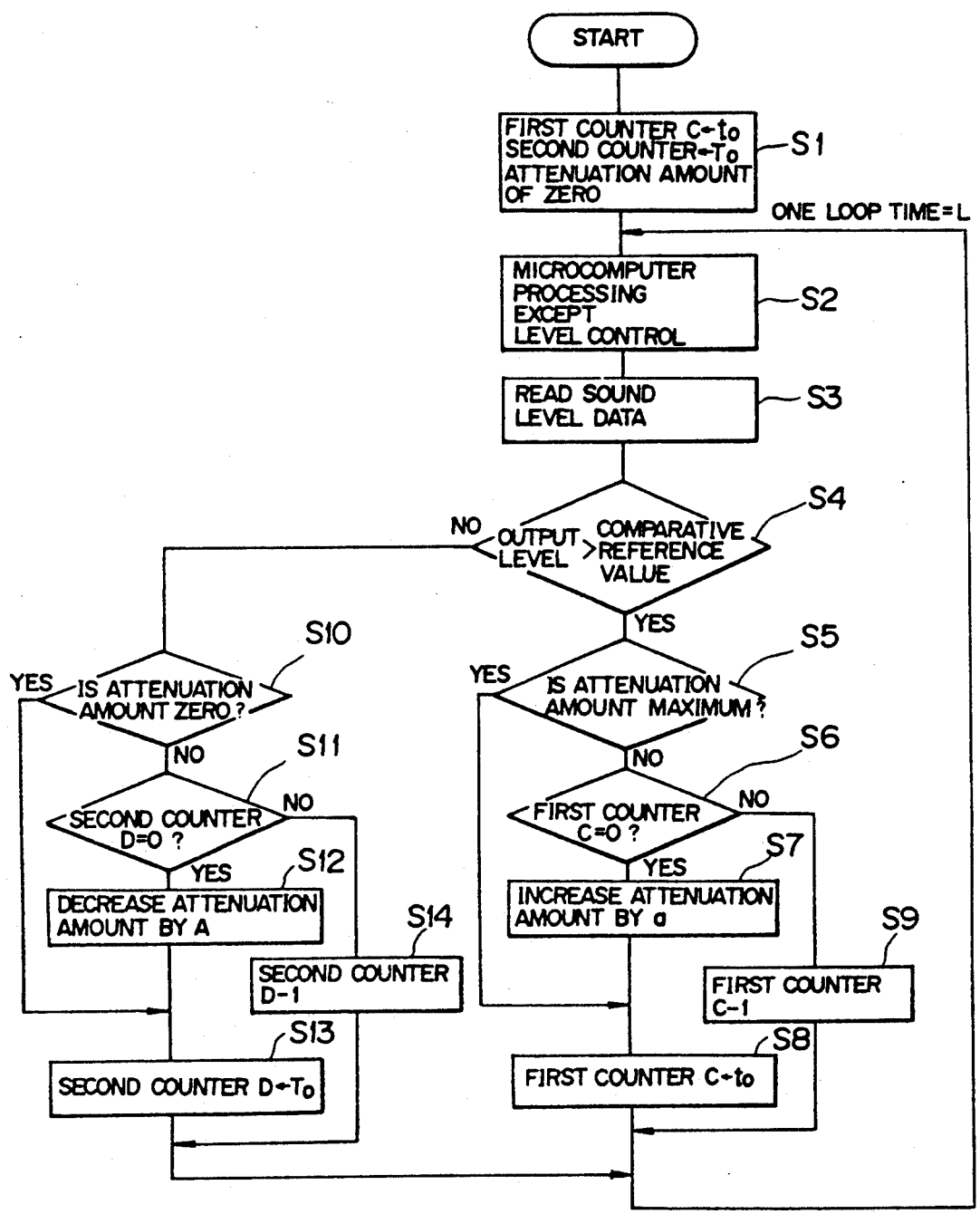
FIG. 4 is a flowchart showing the operation of the first embodiment.

First, the principle of this invention will be explained with reference to FIGS. 1 and 2.

In FIG. 1, an output level controlling apparatus according to one aspect of this invention includes a signal attenuating means 1 for attenuating the reproduced output level of a reading/recording signal RR read from a record medium; signal level deciding means 2 for comparing the reproduced output level of the reading-/recording signal with a reference signal level previously set; and output level correcting means 3 for sending a control signal CS to the signal attenuating means 1 on the basis of results of the comparison made by said signal level deciding means 2 so as to increase an attenuation amount of the reproduced output level of the reading/recording signal RR when the reproduced output level is higher than the reference signal level and so as to decrease an attenuation amount of the reproduced output signal level of the reading/recording signal RR when the reproduced output signal level is lower than the reference signal level, the output level correcting means 3 sending said control signal so as to rapidly decrease or slowly increase the reproduced output level of the reading/recording signal.

In FIG. 2, an output level controlling apparatus according to another aspect of this invention includes a signal attenuating means 1 for attenuating the reproduced output level of a reading/recording signal RR read from a record medium; inter-information signal detecting means 4 for detecting an exchange signal generated during exchange of a plurality of record media or an inter-information signal in the reading-/recording signal RR; signal level deciding means 2 for comparing said reproduced output level of said reading-/recording signal to a reference signal level previously set; and output level correcting means 3 for sending a control signal to said signal attenuating means 1 on the basis of the results of the comparison made by said signal level deciding means 2 so as to increase an attenuation amount of the reproduced output level of the reading/recording signal when the reproduced output level is higher than the reference signal level and so as to decrease an attenuation amount of the reproduced output signal level of the reading/recording signal RR when the reproduced output signal level is lower than the reference signal level, the output level correcting means sending the control signal so as to rapidly attenuate the reproduced output level of the reading/recording signal and slowly increase the reproduced output level, the inter-information signal detecting means 4 sending a reset signal for returning a value attenuation amount set in the signal attenuating means to an initial value when detecting the exchange signal of record media or the inter-information signal.

FIRST EMBODIMENT

A first embodiment of the present invention is described below.

FIG. 3 shows a block diagram of an output level controlling apparatus in accordance with the first embodiment of the present invention.

In FIG. 3, a signal recorded on CD (not shown) is read, and an RF signal is input to a decoder 11 after a predetermined processing. An output signal data as reading/recording signal which is outputted from the decoder 11 is input to a digital attenuator 13 serving as signal attenuating means through a delay circuit 12. The data is subjected to a predetermined attenuation processing in the attenuator 13 and then output to a digital-/analog converter 14. The digital/analogue converter 14 outputs a sound signal. The delay circuit 12 is a circuit for ensuring a processing time required for the controller 16 described below and the time required for sending the control signal to the digital attenuator 3. The signal data outputted from the decoder 11 is also input to a level deciding section 15 serving as level deciding means and the bus B described below. A comparative reference value $V_{ref}$ is set as a reference level for the output signal data in the signal level deciding section 15. The controller 16 serving as output level correcting means comprises the bus B and a CPU 17, a RAM 18, an interface circuit 19 for sending the control singal to the digital attenuator 13 and a ROM 20 for storing a program, all of which are connected to the bus B. An input section 21 for inputting the time factors, attenuation amount and the like, which are described below, is also connected to the bus B.

Figure 6:
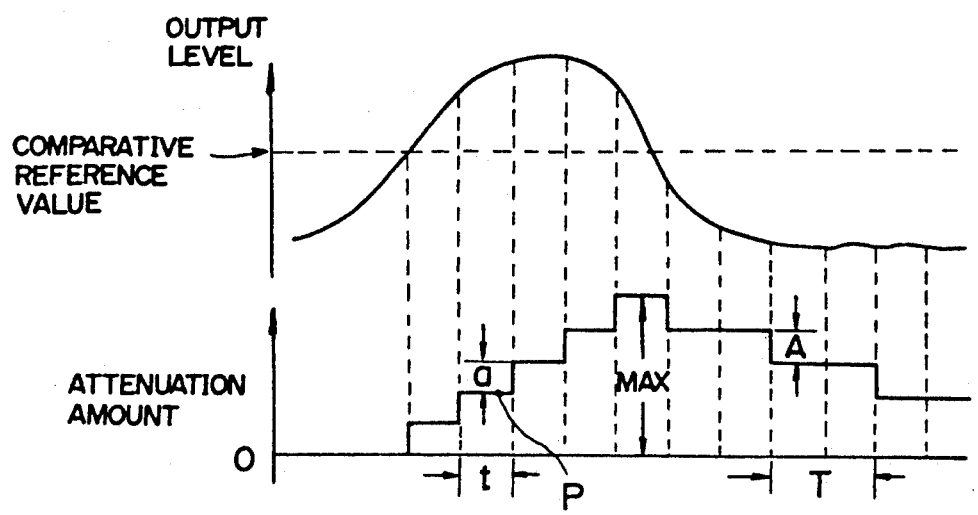
FIG. 6 is a drawing showing changes in an attenuation amount in the above embodiments.

The CPU 17 has an attenuator value deciding section 17a for changing the attenuation amount of the section 17b for detecting the presence of a space between two pieces of music from Q channel data in the sub-coding of CD. The RAM 18 has a first time factor storing section (first counter) 18a, a second time factor storing section (second counter) 18b, an attenuator value storing section 18c, an increment setting section 18d, and a decrement setting section 18e. A time factor $t_0$ for setting a time width t shown in FIG. 6, as described below, is set in the first time factor storing section 18a. A time factor $T_0$ for setting a time width T shown in FIG. 6 is set in the second time factor storing section 18b. In the attenuator value storing section 18c are stored a value determined by the attenuator value deciding section 17a and a value input from the input section 21. An increment and a decrement of the attenuation amount are set in the increment setting section 18d and the decrement setting section 18e, respectively.

The operation of the first embodiment is described below with reference to the flowchart shown in FIG. 4 and the drawing of the operating characteristics shown in FIG. 6.

As shown in FIG. 4, the time factor $t_0$ (positive integer), the time factor $T_0$ (positive integer), the attenuation amount of zero, the increment a and the decrement A are input as initial set values to the first time factor storing section 18a, the second time factor storing section 18b, the attenuator value storing section 18c, the increment setting section 18d and the decrement setting section 18e, respectively (Step S1). After initial setting, a processing without level control described below is performed (Step S2), and the level (sound level data) of the signal outputted from the decoder 11 is read by the level deciding section 15 (Step S3).

A new output level is the calculated on the basis of the output signal level read and the comparative reference value $V_{ref}$. In Step S4, the output signal level is thus compared with the comparative reference value $V_{ref}$ and the following processing is then performed according to the results of comparison:

(1) Output signal level > comparative reference value $V_{ref}$

In this case, as shown in FIG. 6, an attenuation amount is stepwise increased by an amount every time $t=t_0$ (the set value of the first time factor setting section) × L (one loop time shown in FIG. 4) so that the output level is decreased.

In this case, $a \geq A$ and $t \leq T$, which means that attenuation amount is rapidly increased, and it is gently or slowly decreased, and the loop time L is the processing time inherent in the controller 16. This also applies to the case (2) described after.

If it is decided in Step S4 that the output signal level is higher than the comparative reference value $V_{ref}$, data is read from the attenuator value storing section 18c, and a decision is made as to whether the attenuation amount of the digital attenuator 13 is set to the maximum (Step S5). In FIG. 6, the maximum value corresponds Mmax. If the attenuation amount is not the maximum, a decision is made as to whether or not a value stored in the first time factor storing section 18a is zero (Step S6). If the stored value is not zero (Step S6; No), that is, a time position P is located at an intermediate position in FIG. 6, the value stored in the first time factor storing section 18a is decreased by 1 (Step S9), and the flow is then returned to Step S2. Namely, the time width t can be set to any desired value by using the value set in the first time factor storing section 18a. When it is decided in Step S5 that the attenuation amount is set to the maximum (Step S5; Yes), since the attenuation amount cannot be further increased, the time factor $t_0$ is set in the first time factor storing section 8a (Step S8), and the flow is returned to Step S2.

(2) Output signal level < comparative reference value $V_{ref}$

In this case, as shown in FIG. 6, the attenuation amount is stepwise decreased by an amount A each time $T=T_0$ (the value set in the second time factor setting section) × L (one loop time) so that the output level is increased.

It is decided in Step S4 that the output signal level is lower than the comparative reference value $V_{ref}$, a decision is made as to whether or not a value stored in the attenuator value storing section 18c is set to zero (Step S10). If the stored value is not zero (Step S10; No), a decision is made as to whether or not the value stored in the second time factor storing section 18b is zero (Step S11). If the stored value is not zero, the value stored in the second time factor storing section 18b is decreased by 1 (Step S14), and the flow is then returned to Step S2. The above processing is repeated until the value stored in the second time factor storing section 18b is zero. If the stored value is zero (Step S11; Yes), the attenuation amount is decreased by an amount A (Step S12), and the time factor $T_0$ is then set in the second time factor storing section 18b (Step S13). The flow is then returned to Step S2.

If it is decided in Step S10 that the attenuation amount is zero (Step S10; Yes), since the attenuation amount cannot be further decreased, the time factor $T_0$ is set in the second time factor storing section 18b, and the flow is then returned to Step S2.

SECOND EMBODIMENT

A second embodiment of the present invention is described below.

The second embodiment is the same as the first embodiment except that an inter-music space detecting section 17b is added to the CPU 17 in the block diagram of the first embodiment shown in FIG. 3.

The operation of the second embodiment is described below with reference to a flowchart shown in FIG. 5.

Figure 5:
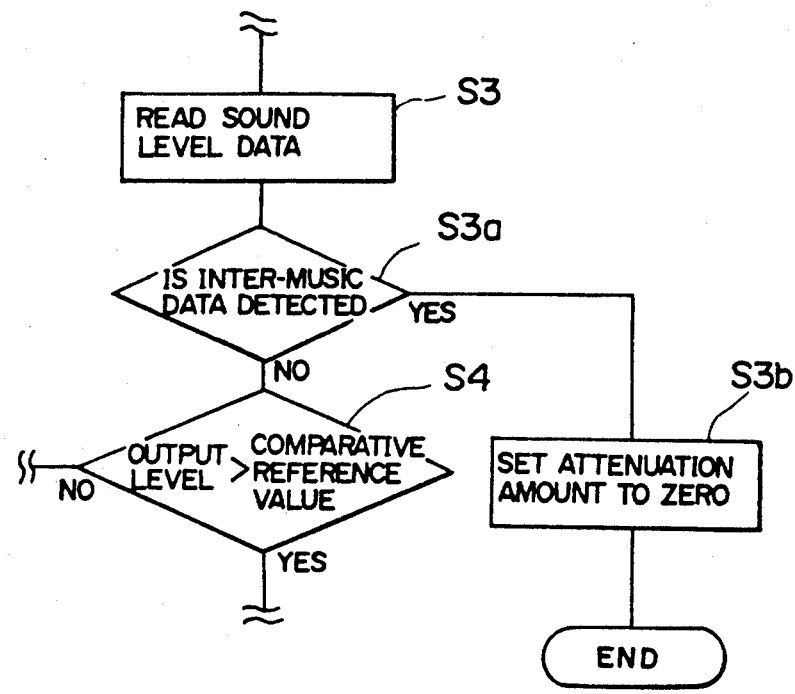
FIG. 5 is a flowchart showing the operation of the second embodiment.

FIG. 5 shows the flowchart in which Step S3a is inserted between Steps S3 and S4 shown in FIG. 4 and which is provided for detecting data about a space between two pieces of music.

As shown in FIG. 5, after the sound level data is read (Step S3), when the inter-music space detecting section 17b serving as inter-information signal detecting means detects inter-music data (Q channel data) (Step S3a; Yes), the attenuation amount of zero is stored in the attenuator value storing section 18c. The reset control signal of the attenuation amount of zero is output to the digital attenuator 13 through the interface 19 (Step S3b) so that the attenuation amount is set to zero. When no inter-music data is detected (Step S3a; No), the processing after Step S4 may be performed in the same way as in the first embodiment.

The output level of music is generally low immediately after the start of playing. When an inter-music space is detected, as described above, if the attenuation amount is set to zero, there is no danger of excessively decreasing the output level of the next piece of music at the start of playing. This causes an improvement in aural feeling.

Although the second embodiment concerns a case in which the initial value of the attenuation amount is set to zero when inter-music data is detected, appropriate initial values other than zero may be set according to musical environments of BGM.

Although the second embodiment also concerns the case of a space between two pieces of music in the same disk, the embodiment can be applied to the disk exchange in an automatic player. In this case, an exchange signal generated during CD exchange or an inter-information signal which is a signal based on the silent portion at the beginning of each CD may be input to the inter-information signal detecting means 4.

Although the above embodiments concern CD, the present invention can be of course applied to LVD (Laser Vision Disk).

As seen from the above description, in the present invention, the attenuation amount is momentarily or rapidly increased, and it is gently or slowly decreased. It is therefore possible to rapidly attenuate a high input level for preventing the output in a high level. It is also possible to prevent the musical environment of BGM from being destroyed and aural vibrations from occurring during level adjustment.

In addition, since the initial value is set in the signal attenuating means after the passage of a time between two pieces of music or when a record medium is replaced by a new one, even if a silent period is present after the passage of the time between two pieces of music or during the exchange, there is neither sudden change in the output level at the start of the next piece of music nor feeling of aural discomfort.

What is claimed is:

1. An output level controlling apparatus comprising:
   signal attenuating means for attenuating a reproduced output level of a reading/recording signal read from a record medium with an attenuation amount which is controlled to be increased and decreased at a different rate versus time according to a control signal input into said signal attenuating means;
   signal level deciding means for comparing said reproduced output level of said reading/recording signal with a reference signal level previously set; and
   output level correcting means, to which first information prescribing an increasing rate to increase said attenuation amount and second information prescribing a decreasing rate to decrease said attenuation amount are set, for sending the control signal to said signal attenuating means on the basis of results of the comparison made by said signal level deciding means so as to increase the attenuation amount at a prescribed increasing rate when said reproduced output level is higher than said reference signal level and so as to decrease the attenuation amount at a prescribed decreasing rate when said reproduced output signal level is lower than said reference signal level.

2. An output level controlling apparatus comprising:
   signal attenuating means for attenuating a reproduced output level of a reading/recording signal read from a recording medium;
   signal level deciding means for comparing said reproduced output level of said reading/recording signal with a reference signal level previously set; and
   output level correcting means for sending a control signal to said signal attenuating means on the basis of results of the comparison made by said signal level deciding means so as to increase an attenuation amount of said reproduced output level of said reading/recording signal when said reproduced output level is higher than said reference signal level and so as to decrease an attenuation amount of said reproduced output signal level of said reading/recording signal when said reproduced output signal level is lower than said reference signal level, said output level correcting means producing said control signal so as to rapidly attenuate said reproduced output level of said reading/recording signal and slowly increase said reproduced output level; and
   wherein said output level correcting means comprises a CPU for controlling a change in the amount of attenuation, a first memory means for storing necessary data for attenuating the reproduced output level, an interface means for sending a control signal for correcting an output level, and a second memory means for storing a program for controlling said output level correcting means.

3. An output level apparatus according to claim 2, wherein said CPU comprises an attenuator value deciding section for changing an attenuation amount and an inter-music space detecting section for detecting a space between two pieces of music from the record medium concerned.

4. An output level controlling apparatus according to claim 2, wherein said second memory means comprises a first time factor storing section for setting a first time factor used for increasing an attenuation amount, a second time factor storing section for setting a second time factor used for decreasing said attenuation amount, an attenuation value storing section for storing an attenuator value determined by said attenuator value deciding means and a value input from an external device, an increment setting section for setting an increment of said attenuation amount, and a decrement setting section for setting a decrement of said attenuation amount.

5. An output level controlling apparatus according to claim 4, wherein a value of said first time factor is equal to or smaller than a value of said second time factor.

6. An output level controlling apparatus according to claim 4, wherein said increment set in said increment setting section is equal to or smaller than said decrement set in said decrement setting section.

7. An output level controlling apparatus comprising:
signal attenuating means for attenuating a reproduced output level of a reading/recording signal read from a recording medium;
inter-information signal detecting means for detecting an exchange signal generated during exchange of a plurality of recording media or an inter-information signal in said reading/recording signal;
signal level deciding means for comparing said reproduced output level of said reading/recording signal to a reference signal level previously set; and
output level correcting means for sending a control signal to said signal attenuating means on the basis of results of the comparison made by said signal level deciding means so as to increase an attenuation amount of said reproduced output level of said reading/recording signal when said reproduced output level is higher than said reference signal level and so as to decrease an attenuation amount of said reproduced output signal level of said reading/recording signal when said reproduced output signal level is lower than said reference signal level, said output level correcting means sending said control signal so as to rapidly attenuate said reproduced output level of said reading/recording signal and slowly increase said reproduced output level, said inter-information signal detecting means sending a reset signal for returning a value attenuation amount set in said signal attenuating means to an initial value when detecting said exchange signal of record media or said inter-information signal.

8. An output level controlling apparatus according to claim 7, wherein said output level correcting means comprises a CPU for controlling a change in the amount of attenuation, a first memory means for storing necessary data for attenuating the reproduced output level, an interface means for sending a control signal for correcting an output level, and a second memory means for storing a program for controlling said output level correcting means.

9. An output level controlling apparatus according to claim 8, wherein said CPU comprises an attenuator value deciding section for changing an attenuation amount and an inter-music space detecting section for detecting a space between two pieces of music from the record medium concerned.

10. An output level controlling apparatus according to claim 8, wherein said second memory means comprises a first time factor storing section for setting a first time factor used for increasing an attenuation amount, a second time factor storing section for setting a second time factor used for decreasing said attenuation amount, an attenuator value storing section for storing an attenuator value determined by said attenuator value deciding means and a value input from an external device, an increment setting section for setting an increment of said attenuation amount and a decrement setting section for setting a decrement of said attenuation amount.

11. An output level controlling apparatus according to claim 10, wherein a value of said first time factor is equal to or smaller than a value4 of said second time factor.

12. An output level controlling apparatus according to claim 10, wherein said increment set in said increment setting section is equal to or smaller than said decrement set in said decrement setting section.

* * * * *